(12) United States Patent
Choi et al.

(10) Patent No.: US 9,653,608 B2
(45) Date of Patent: May 16, 2017

(54) ARRAY SUBSTRATE AND MANUFACTURING METHOD THEREOF, DISPLAY DEVICE AND THIN FILM TRANSISTOR

(71) Applicant: BOE Technology Group Co., Ltd., Beijing (CN)

(72) Inventors: Seungjin Choi, Beijing (CN); Heecheol Kim, Beijing (CN); Youngsuk Song, Beijing (CN); Seongyeol Yoo, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 134 days.

(21) Appl. No.: 14/409,179

(22) PCT Filed: May 24, 2014

(86) PCT No.: PCT/CN2014/078356
§ 371 (c)(1),
(2) Date: Dec. 18, 2014

(87) PCT Pub. No.: WO2015/096374
PCT Pub. Date: Jul. 2, 2015

(65) Prior Publication Data
US 2016/0260843 A1 Sep. 8, 2016

(30) Foreign Application Priority Data
Dec. 23, 2013 (CN) .......................... 2013 1 0717908

(51) Int. Cl.
*H01L 29/786* (2006.01)
*H01L 27/12* (2006.01)
*H01L 29/423* (2006.01)

(52) U.S. Cl.
CPC ...... *H01L 29/78633* (2013.01); *H01L 27/124* (2013.01); *H01L 27/1225* (2013.01);
(Continued)

(58) Field of Classification Search
CPC H01L 27/124; H01L 27/1259; H01L 27/1225
See application file for complete search history.

(56) References Cited

U.S. PATENT DOCUMENTS 6,891,523 B2 * 5/2005 Ozawa .............. G02F 1/136204
257/59
8,022,411 B2 9/2011 Yoon et al.
(Continued)

FOREIGN PATENT DOCUMENTS

CN 102236221 A 11/2011
CN 102244034 A 11/2011
(Continued)

OTHER PUBLICATIONS

Sep. 2, 2015—(CN) First Office Action Appn 201310717908.X with English Tran.
(Continued)

*Primary Examiner* — Marc Armand
*Assistant Examiner* — Shannon Yi
(74) *Attorney, Agent, or Firm* — Banner & Witcoff, Ltd.

(57) ABSTRACT

An array substrate and a manufacturing method thereof, a display device and a thin film transistor are provided. The method includes forming a pattern that includes an active layer, a pixel electrode and a data line on a base substrate; forming a pattern that includes a gate insulating layer and at least two gate via-holes therein, the at least two gate via-holes are located in regions in the gate insulating layer that correspond to outer surroundings of the active layer and do not overlap with areas where the pixel electrode and the data line are located; forming a pattern that includes a gate
(Continued)

line and at least two gate electrodes, the at least two gate electrodes are connected to the gate line, and are provided in the at least two gate via-holes, respectively. With this method, the fabricating process and the fabricating cost are saved.

20 Claims, 5 Drawing Sheets

(52) U.S. Cl.
CPC .... *H01L 27/1288* (2013.01); *H01L 29/42384* (2013.01); *H01L 29/7869* (2013.01); *H01L 29/78648* (2013.01); *H01L 29/78696* (2013.01); *H01L 2029/42388* (2013.01)

(56) References Cited

U.S. PATENT DOCUMENTS

| | | | | |
|---|---|---|---|---|
| 2010/0220254 | A1* | 9/2010 | Liu | H01L 33/08 349/46 |
| 2011/0068341 | A1* | 3/2011 | Li | H01L 27/12 257/59 |
| 2012/0038585 | A1* | 2/2012 | Kim | G06F 3/0412 345/174 |
| 2014/0204315 | A1* | 7/2014 | Park | G02F 1/136286 349/65 |
| 2015/0153600 | A1* | 6/2015 | Won | H01L 27/127 349/43 |

FOREIGN PATENT DOCUMENTS

| | | |
|---|---|---|
| CN | 102479752 A | 5/2012 |
| CN | 102655155 A | 9/2012 |
| CN | 103681514 A | 3/2014 |
| WO | 2008059633 A1 | 5/2008 |

OTHER PUBLICATIONS

Sep. 25, 2014—International Search Report and Written Opinion Appn PCT/CN2014/078356 with Eng Tran.
Jun. 28, 2016—International Preliminary Report on Patentability Appn PCT/CN2014/078356.
International Search Report and Written Opinion mailed Sep. 25, 2014 (PCT/CN2014/078356); ISA/CN.

* cited by examiner

ARRAY SUBSTRATE AND MANUFACTURING METHOD THEREOF, DISPLAY DEVICE AND THIN FILM TRANSISTOR

The application is a U.S. National Phase Entry of International Application PCT/CN2014/078356 filed on May 24, 2014, designating the United States of America and claiming priority to Chinese Patent Application No. 201310717908.X, filed on Dec. 23, 2013. The present application claims priority to and the benefit of the above-identified applications and the above-identified applications are incorporated by reference herein in their entirety.

TECHNICAL FIELD

At least one embodiment of the present invention relates to an array substrate and a manufacturing method thereof, a display device and a thin film transistor.

BACKGROUND

Regarding an oxide thin film transistor (Oxide TFT), in order to improve stability, a dual-gate (namely, two gate electrodes) structure is applied in the TFT. As shown in FIG. 1, two gate electrodes, namely, a top gate electrode 1 at the top and a bottom gate electrode 2 at the bottom, are included in a TFT structure, and a gate insulating layer and an active layer that is formed of an oxide are located between the top gate electrode 1 and the bottom gate electrode 2. The top gate electrode 1 and the bottom gate electrode 2 act jointly to turn on the TFT. The dual-gate structure has the following advantages over a single-gate structure: channels are formed on upper and lower sides, respectively, so that an on-state current (Ion) is increased, and accordingly, it is possible that the size of the TFT is decreased, and the transmittance is enhanced; furthermore, when an oxide semiconductor layer is adopted, the gate metal can provide a function of shielding protection of the oxide on two sides of the semiconductor layer, so as to prevent occurrence of a leakage-current phenomenon owing to incidence of an external light onto the semiconductor layer, and in turn, the possibility that undesired phenomena such as afterimages and so on occur is reduced.

SUMMARY

According to at least one embodiment of the present invention, there is provided a manufacturing method of an array substrate, comprising: forming a pattern that includes an active layer, a pixel electrode and a data line on a base substrate, the active layer and the pixel electrode are located on the same layer and connected to each other, and the data line is located on the active layer; forming a pattern that includes a gate insulating layer and at least two gate via-holes in the gate insulating layer on the pattern of the active layer, the pixel electrode and the data line, the at least two gate via-holes are located in regions in the gate insulating layer that correspond to outer surroundings of the active layer and do not overlap with areas where the pixel electrode and the data line are located, the gate via-holes are separated from the active layer, the pixel electrode and the data line by the gate insulating layer; and forming a pattern that includes at least one gate line and at least two gate electrodes, the at least two gate electrodes are connected to the at least one gate line, and are provided in the at least two gate via-holes, respectively.

According to at least another embodiment of the invention, there is provided an array substrate, comprising: a base substrate, a pixel electrode, an active layer, a data line, a gate insulating layer and a gate metal layer, the pixel electrode and the active layer are located on the base substrate and connected to each other, the data line is located on the active layer, the gate insulating layer covers the base substrate, the pixel electrode, the active layer and the data line, in regions in the gate insulating layer that correspond to outer surroundings of the active layer and do not overlap with areas where the pixel electrode and the data line are located, there are formed at least two gate via-holes, the at least two gate via-holes are separated from the active layer, the pixel electrode and the data line by the gate insulating layer; and the gate metal layer includes at least one gate line and at least two gate electrodes that are connected to the at least one gate line, and provided in the at least two gate via-holes, respectively.

According to at least still another embodiment of the invention, there is provided a display device, comprising the array substrate as stated above.

According to at least yet still another embodiment of the invention, there is provided a thin film transistor, comprising a source electrode, an active layer, a drain electrode, a gate insulating layer and at least two gate electrodes, wherein the source electrode and the active layer at least partially overlap, the drain electrode and the active layer are located on the same layer and connected together, the gate insulating layer covers the source electrode, the active layer and the drain electrode, in regions in the gate insulating layer that correspond to outer surroundings of the active layer and do not overlap with areas where the drain electrode and the source electrode are located, there are formed at least two gate via-holes, and the at least two gate via-holes are separated from the active layer, the pixel electrode and the data line by the gate insulating layer; the at least two gate electrodes are connected to at least one gate line, and provided in the at least two gate via-holes, respectively.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

Figure 1:
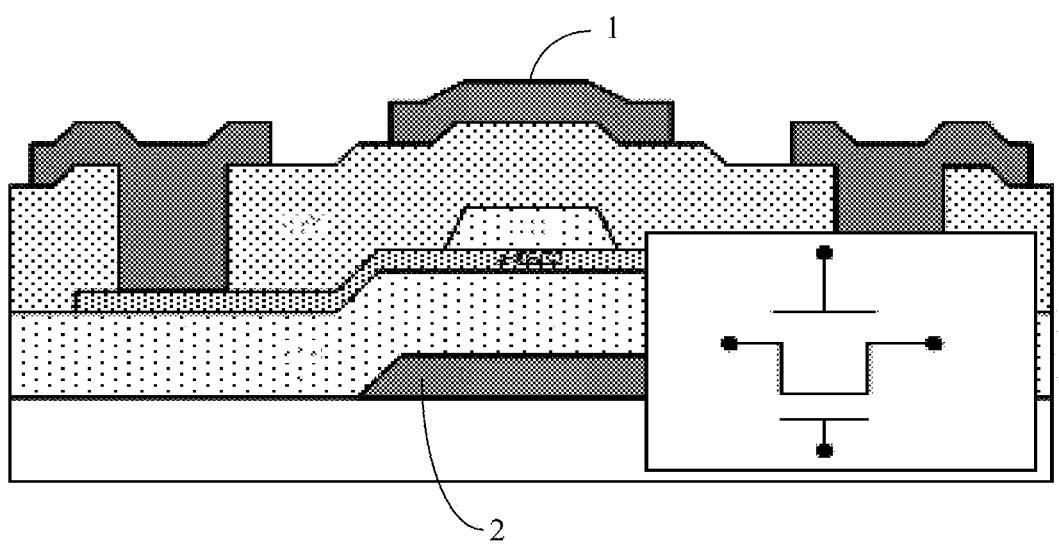
FIG. 1 is a structurally schematic view illustrating a dual-gate structured TFT.

Inventors of the present invention have noted that, as compared to the manufacturing process of an array substrate of a single-gate structured TFT, the manufacture of an array substrate of a dual-gate structured TFT requires addition of a gate layer, and thus, the manufacturing procedure is relatively complex and the cost is higher. Production of an array substrate of a dual-gate structured TFT in FIG. 1 needs 7 mask processes, which are used from bottom to top for forming a bottom gate electrode, an active layer, a via-hole of a top-gate gate insulating layer, a top gate electrode and source/drain connecting electrodes, an insulating layer and a via-hole in this insulating layer, a data line and a source electrode, a pixel electrode, respectively. Merely the top gate electrode and structures underlying it are shown in FIG. 1. The fabricating cost of one mask process is high.

A manufacturing method of an array substrate according to at least one embodiment of the invention includes the following steps.

Step 1, a pattern that includes an active layer, a pixel electrode and a data line is formed on a base substrate (a transparent substrate, such as, a glass substrate or a quartz substrate), so that the active layer and the pixel electrode are located on the same layer, and connected to each other, and the data line is located on the active layer. For example, the step includes the following procedures.

As shown in FIGS. 2 to 5, an oxide semiconductor thin film 300' and a metal thin film 200' are formed on a base substrate 100 in sequence, so that the pattern of an oxide semiconductor layer 300" and a data line 200 is formed, such as, through a patterning process.

Figure 2:
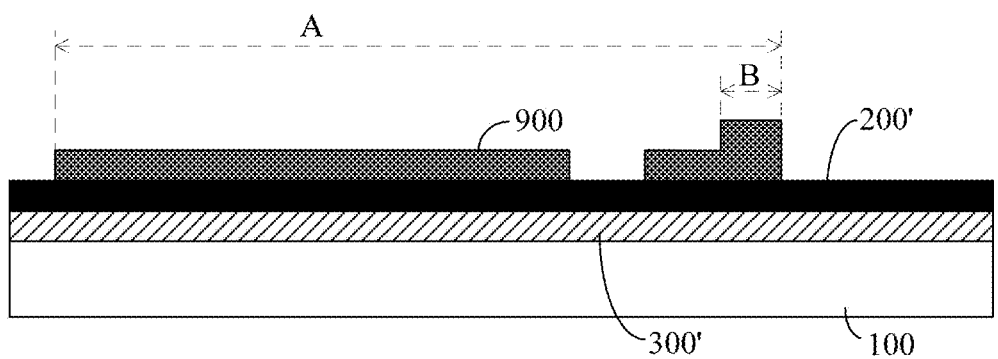
FIG. 2 is a structurally, schematically sectional view illustrating formation of an oxide semiconductor thin film, a metal thin film and a photoresist on a base substrate in a manufacturing method of an array substrate according to at least one embodiment of the invention.
Figure 3:
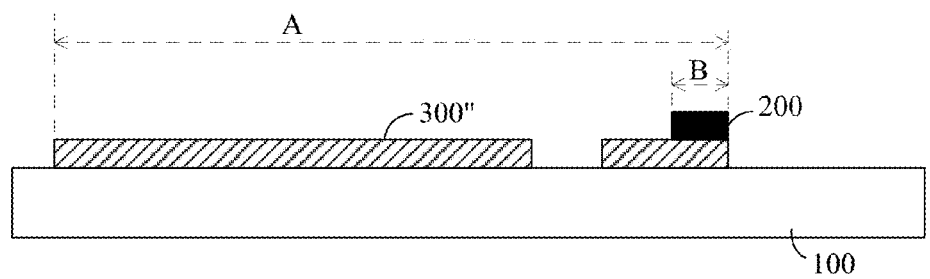
FIG. 3 is a structurally, schematically sectional view illustrating formation of the pattern of an oxide semiconductor layer and a data line on the basis of FIG. 2.

The patterning process includes photoresist coating, exposing, developing, etching, photoresist stripping and other process; and the specific process, for example, as shown in FIG. 2, includes coating a photoresist 900 on the metal thin film 200', conducting exposure and development on the photoresist 900 with, such as, a double-tone mask (e.g., a half-tone mask or a grey-tone mask), so that the photoresist 900 in a region for a pixel electrode and an active layer (i.e., a region A) is retained, and the thickness of the photoresist 900 in a region corresponding to a data line (i.e., a region B) in the region A is larger than the thickness of the photoresist 900 in the rest region; etching off the oxide semiconductor thin film 300' and the metal thin film 200' that have been thus exposed; conducting such as an ashing treatment on the photoresist 900, so that the photoresist 900 in the region A except the region B is removed in ashing, and the photoresist 900 in the region B is partially retained; as shown in FIG. 3, etching off the exposed metal thin film 200' and removing by ashing the photoresist 900 in the region B through, such as, an ashing treatment, so that the data line 200 and the oxide semiconductor layer 300" are formed.

Figure 4:
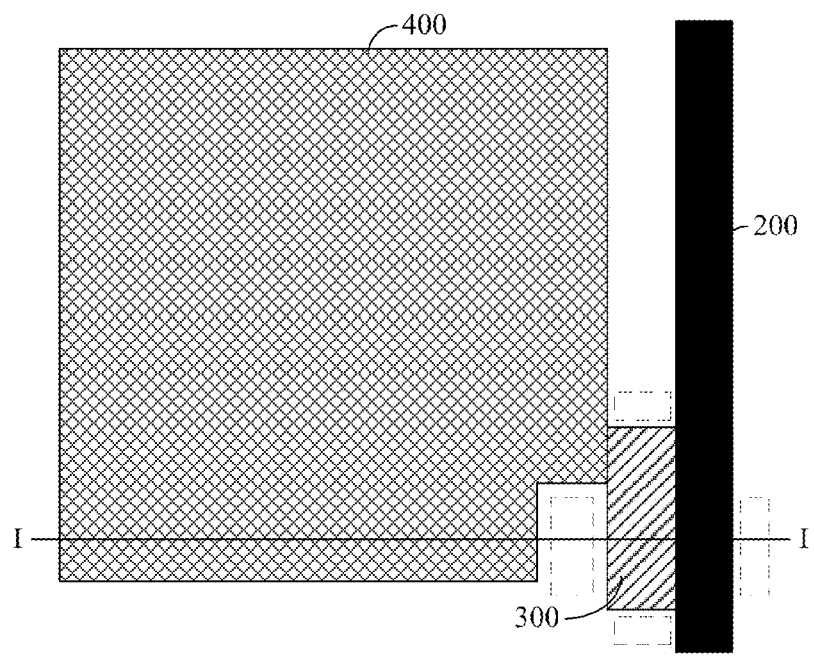
FIG. 4 is a structurally, schematically planar view illustrating formation of a pixel electrode and an active layer on the basis of FIG. 3.
Figure 5:
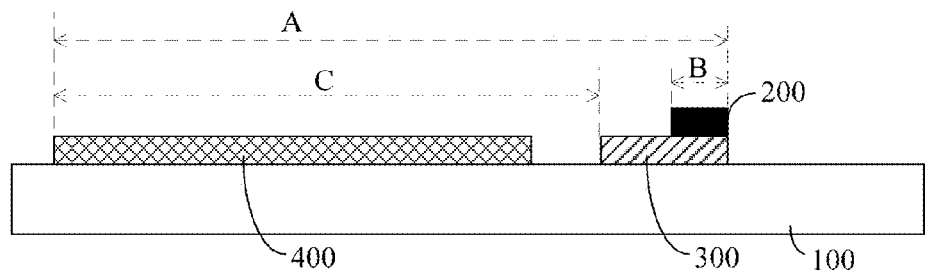
FIG. 5 is a structurally, schematically sectional view taken along I-I in FIG. 4.

As shown in FIG. 4 and FIG. 5, for example, a plasma treatment is conducted on a region corresponding to a pixel electrode 400 on the oxide semiconductor layer 300" to turn the semiconductor into a conductor, so that the pixel electrode 400 is formed. Other region on the oxide semiconductor layer 300" (i.e., the region in the region A except a region C) is still of an oxide semiconductor material, and an active layer 300 is formed by the oxide semiconductor that is not subjected to the plasma treatment. Therefore, the pixel electrode 400 and the active layer 300 are located on the same layer, and can be formed in a same patterning process, and the data line 200 can be made to be located on the active layer 300 through the patterning process.

Step 2, a pattern that includes a gate insulating layer and at least two gate via-holes therein is formed on the pattern of the active layer, the pixel electrode and the data line, so that the gate via-holes are situated in regions in the gate insulating layer that correspond to the outer surroundings of the active layer and do not overlap with the areas where the pixel electrode and the data line are located, and the gate via-holes are separated from the active layer, the pixel electrode and the data line by the gate insulating layer. For example, the step includes the following procedures.

Figure 6:
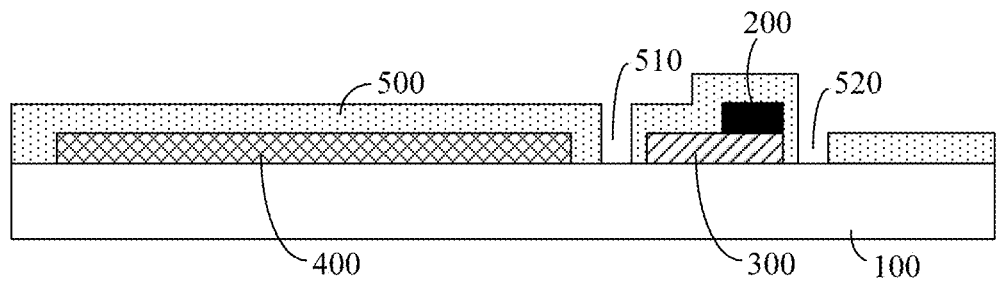
FIG. 6 is a structurally, schematically sectional view illustrating formation of a gate insulating layer and a gate via-hole therein on the basis of FIG. 5.

As shown in FIG. 6, a gate insulating thin film, the thickness of which may be in the range of 2000 Å to 6000 Å, is formed on the pattern of the active layer 300, the pixel electrode 400 and the data line 200. At least two gate via-holes are formed in regions (e.g., regions denoted by dashed-line boxes in FIG. 4) on the gate insulating thin film that correspond to outer surroundings of the active layer 300 and do not overlap with areas where the pixel electrode 400 and the data line 200 are located, so as to form the pattern of the gate insulating layer 500. In order to ensure that the gate metal in the gate via-holes does not contact with the active layer 300, the pixel electrode 400 and the data line 200 in subsequent steps, the gate via-holes and the active layer 300, the pixel electrode 400 and the data line 200 are separated with the gate insulating layer 500.

Theoretically, a gate via-hole can be formed in each of the four regions denoted by dashed-line boxes in FIG. 4, so that a gate electrode surrounds the active layer 300 from four sides of the active layer 300. In some embodiments of the invention, as shown in FIG. 6, for the ease of design layout, descriptions will be given with reference to an example in which two gate via-holes (a first gate via-hole 510 and a second gate via-hole 520) are formed.

In at least one embodiment of the invention, the first gate via-hole 510 and the second gate via-hole 520 are formed to surround the active layer 300 and located on two sides of the data line 200, respectively. The thickness of the gate insulating layer 500 between the active layer 300 and each of the first gate via-hole 510 and the second gate via-hole 520 is in the range of 500 Å to 4000 Å.

Figure 7:
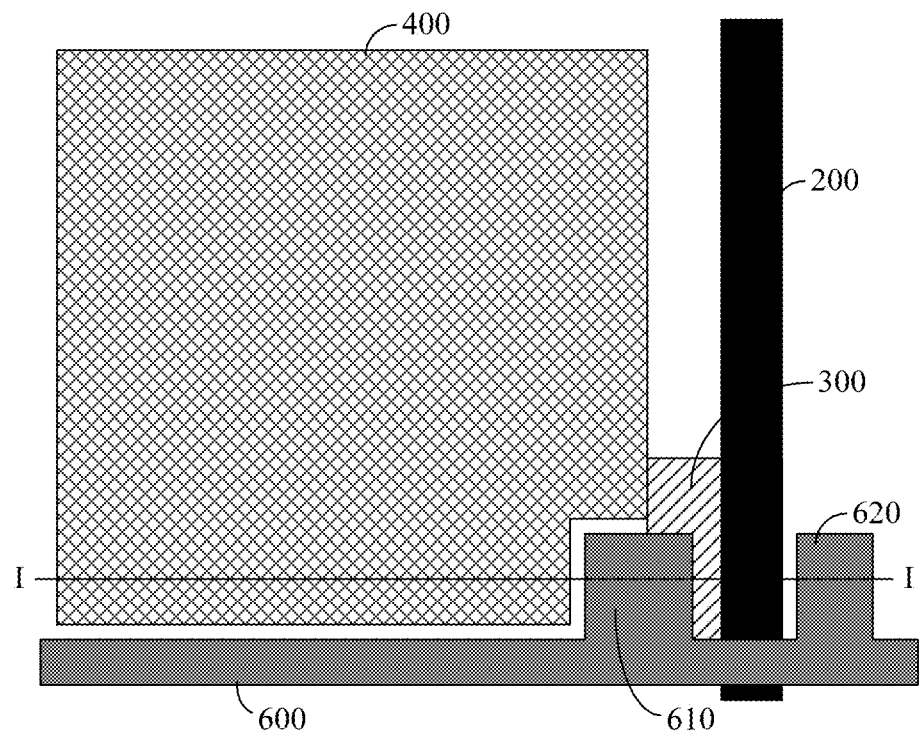
FIG. 7 is a structurally, schematically planar view illustrating an array substrate according to at least another embodiment of the invention.
Figure 8:
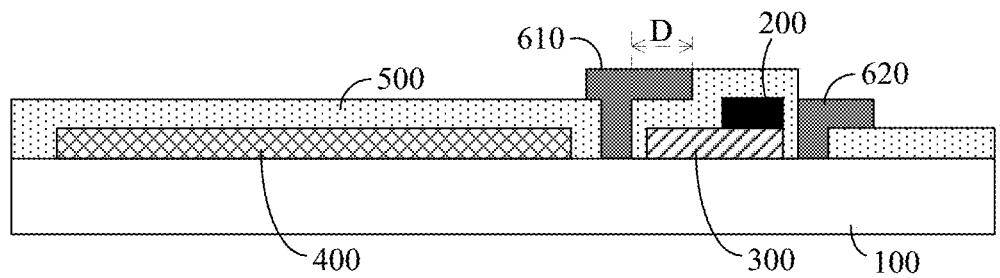
FIG. 8 is a structurally, schematically sectional view taken along I-I in FIG. 7.

Step 3, a pattern that includes at least one gate line and at least two gate electrodes is formed, so that the at least two gate electrodes are connected to the at least one gate line and located in the at least two gate via-holes, respectively. In the embodiment, as for one pixel electrode, descriptions will be given to an example in which one gate line and two gate electrodes (corresponding to two gate via-holes in FIG. 6) are formed. As shown in FIGS. 7 and 8, with this step, for example, a gate line 600 and two gate electrodes (a first gate electrode 610 and a second gate electrode 620) integrally formed with the gate line 600 may be formed on the gate insulating layer 500. The first gate electrode 610 is situated in the first gate via-hole 510, and the second gate electrode 620 is situated in the second gate via-hole 520. The first gate electrode 610 and the second gate electrode 620 may be entirely formed in corresponding gate via-holes, and may also be partially formed in the via-holes. The first gate electrode 610 and the second gate electrode 620 act on the active layer 300 from two sides, respectively.

In at least one embodiment of the invention, upon formation of at least two gate electrodes, at least one gate electrode forms a gate extending section that extends to the region that lies above the active layer 300 and is not covered by the data line 200, and the area where the gate extending section is located does not overlap with the area where the data line 200 is located. As shown in FIG. 8, when the first gate electrode 610 is formed, one gate extending section (a portion denoted by a region D) is integrally formed with the first gate electrode 610. The gate extending section is equivalent to a top gate, that is, the first gate electrode 610 acts on the active layer 300 from the side and top, so that the current Ion is increased. Thus, the size of the TFT is further decreased, and the transmittance is enhanced. Moreover, the structure allows the gate metal to provide a better shielding protection of the oxide semiconductor layer from its outer surroundings, so as to prevent occurrence of a leakage-current phenomenon owing to incidence of an external light onto the semiconductor layer. In turn, the probability that undesired phenomena such as afterimages and so on occur is reduced.

Figure 9:
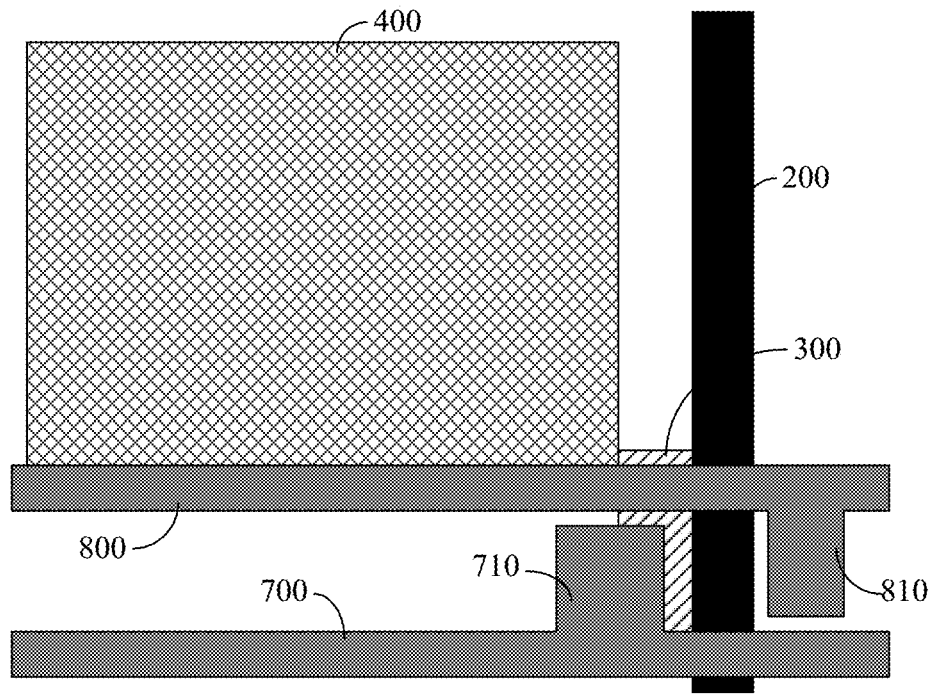
FIG. 9 is a structurally, schematically planar view illustrating another array substrate according to at least still another embodiment of the invention.

In at least one embodiment of the invention, step 1 and step 2 are similar to those in the above-described embodiment, and in step 3, two gate lines may be formed for one pixel electrode, as shown in FIGS. 6 and 9, a first gate line 700 and a second gate line 800 are formed. A first gate electrode 710 and the first gate line 700 are formed integrally, and a second gate electrode 810 and the second gate line 800 are formed integrally. The first gate electrode 710 is situated in a first gate via-hole 510, and the second gate electrode 810 is situated in a second gate via-hole 520. As different gate electrodes are connected to different gate lines, a separate control of gate electrodes can be realized.

When two gate electrodes are connected to one gate line, aperture ratio will not be disadvantageously affected as compared to two gate lines. While two gate lines are adopted, compensation may be conducted for offset of a threshold voltage. The threshold voltage may be changed over voltage across one of the gate electrodes, and when signals are provided by the two gate electrodes, respectively, compensation may be conducted by utilizing voltage across one of the gate electrodes.

In the method according to at least one embodiment of the invention, the active layer, the pixel electrode and the data line may be formed in the step S1 through one patterning process, gate via-holes may be formed in the step S2 through one patterning process, and a gate line, a top gate electrode and a side gate electrode may be formed through one patterning process. Thus, an array substrate can be formed through three patterning processes, i.e., with three masking processes. Therefore, the fabricating process and the fabricating cost are saved considerably.

According to at least one embodiment of the invention, there is further provided an array substrate. As shown in FIGS. 7 and 8, the array substrate includes a base substrate 100, a pixel electrode 400, an active layer 300, a data line 200, a gate insulating layer 500 and a gate metal layer. The pixel electrode 400 and the active layer 300 are located on the base substrate 100 and are connected to each other. As can be seen from the above method, the pixel electrode 400 and the active layer 300 are formed integrally, and the method as stated in the above embodiments may be applied for their forming method, thus details being omitted here. The data line 200 is located on the active layer 300. The gate insulating layer 500 covers the base substrate 100, the pixel electrode 400, the active layer 300 and the data line 200, and a thickness of the gate insulating layer 500 may be in the range of 2000 Å to 6000 Å. At least two gate via-holes are formed in regions on the gate insulating layer 500 that correspond to the outer surroundings of the active layer 300 and do not overlap with areas where the pixel electrode 400 and the data line 200 are located. The at least two gate via-holes and the active layer 300, the pixel electrode 400 and the data line 200 are separated with the gate insulating layer 500. The thickness of the gate insulating layer 500 between the active layer 300 and each of the at least two gate via-holes may be in the range of 500 Å to 4000 Å. In at least one embodiment of the invention, the at least two gate via-holes may include two gate via-holes, which includes a first gate via-hole 510 and a second gate via-hole 520, as shown in FIG. 6. The gate metal layer includes at least one gate line and at least two gate electrodes, and the at least two gate electrodes are connected to the at least one gate line and are provided in the at least two gate via-holes, respectively. In at least one embodiment of the invention, the at least one gate line may include one gate line 600, as shown in FIG. 7. In at least one embodiment of the invention, the gate metal layer may include two gate electrodes, i.e., a first gate electrode 610 and a second gate electrode 620, and the first gate electrode 610 and the second gate electrode 620 may be each formed integrally with the gate line 600. In at least two gate electrodes of the array substrate provided by at least one embodiment of the invention, at least one of them is formed with a gate extending section, which extends to a region that lies above the active layer 300 and is not covered by the data line 200, and the area where the gate extending section is located does not overlap with the area where the data line 200 is located. As shown in FIG. 8, the first gate electrode 610 is formed with a gate extending section (a portion denoted by the region D). The gate extending section is equivalent to a top gate, that is, the first gate electrode 610 acts on the active layer 300 from the side and top, and the gate electrode surrounds the active layer 300 from both the side and the top of the active layer 300, so that a current Ion is increased. Further, the size of the TFT is decreased, and the transmittance is enhanced. Moreover, the gate metal can provide better shielding protection to the oxide from surroundings of the semiconductor layer, so as to prevent occurrence of a leakage-current phenomenon owing to incidence of an external light onto the semiconductor layer. In turn, the probability that undesired phenomena such as afterimages and so on is reduced.

In at least one embodiment of the invention, as for one pixel electrode, the gate metal layer may include two gate lines and two gate electrodes, as shown in FIGS. 6 and 9, which include a first gate line 700 and a second gate line 800 as well as a first gate electrode 710 and a second gate electrode 810. The first gate electrode 710 and the first gate line 700 are integrally formed, the second gate electrode 810 and the second gate line 800 are integrally formed, the first gate electrode 710 is situated in a first gate via-hole 510, and the second gate electrode 810 is situated in a second gate via-hole 520. As different gate electrodes are connected to different gate lines, a separate control on gate electrodes can be realized.

The TFT in the array substrate produced by the method according to the above embodiment of the invention has a special structure, in which one of the at least two gate electrodes acts to drive the TFT from one side (or the side and the top) of the active layer and another one acts to drive the TFT from one side of the active layer. Moreover, the TFT in the above embodiment of the invention has no obvious source and drain electrodes, an overlapping portion between the data line 200 and the active layer 300 is equivalent (or configured) to a source electrode of the TFT, and the active layer 300 and the pixel electrode 400 are connected together. The structure of direct connection is equivalent to achieving the function of a drain electrode (or configured as a drain electrode of the TFT). Therefore, the material is saved, and the cost is reduced.

Figure 10:
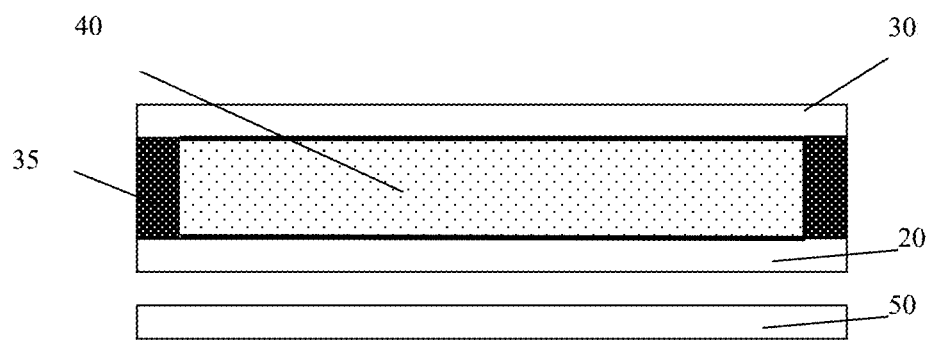
FIG. 10 is a structurally, schematically sectional view illustrating a display device according to at least yet still another embodiment of the invention.

According to at least one embodiment of the invention, there is further provided a display device, comprising the above array substrate. For example, as shown in FIG. 10, the display device in the embodiment of the invention may include an array substrate 20 and a counter substrate 30, which are disposed opposite each other and are formed into a liquid crystal cell through sealant 35, and a liquid crystal material 40 is filled in the liquid crystal cell. The counter substrate 30 is such as a color filter substrate. A pixel electrode for each pixel unit of the array substrate 20 serves to apply an electric filed for control of the rotation degree of the liquid crystal material, so as to perform a display operation. In some embodiments, the display device further includes a backlight source 50 for providing the array substrate 20 with backlight.

The display device may be a liquid crystal panel, an electronic paper, an OLED panel, a cell phone, a tablet computer, a television, a display, a notebook computer, a digital photo-frame, a navigator, or any product or component having a display function.

According to at least one embodiment of the invention, there is further provided a thin film transistor, an exemplary structure of which is shown in FIG. 8 and FIG. 9.

The above embodiments are merely used to explain the present invention, but are not limitative of the invention. Various changes and variants can be made by those ordinarily skilled in the related art without departing from the spirit and scope of the invention, and thus, all equivalent technical solutions pertain to the scope of the invention as well. The patent protection scope of the invention shall be defined by claims.

This application claims the benefit of priority from Chinese patent application No. 201310717908.X, filed on Dec. 23, 2013, the disclosure of which is incorporated herein in its entirety by reference as a part of the present application.

The invention claimed is:

1. A manufacturing method of an array substrate, comprising:

forming a pattern that includes an active layer, a pixel electrode and a data line on a base substrate, wherein the active layer and the pixel electrode are located on the same layer and connected to each other, and the data line is located on the active layer;

forming a pattern that includes a gate insulating layer and at least two gate via-holes in the gate insulating layer on the pattern of the active layer, the pixel electrode and the data line, wherein the gate via-holes are located in regions in the gate insulating layer that correspond to outer surroundings of the active layer and do not overlap with areas where the pixel electrode and the data line are located, the gate via-holes are separated from the active layer, the pixel electrode and the data line by the gate insulating layer; and forming a pattern that includes at least one gate line and at least two gate electrodes, wherein the at least two gate electrodes are connected to the at least one gate line, and are provided in the at least two gate via-holes, respectively.

2. The manufacturing method of the array substrate claimed as claim 1, wherein an oxide semiconductor thin film and a metal thin film are formed on the base substrate in sequence, and a pattern of an oxide semiconductor layer and the data line is formed through one patterning process; and a treatment is conducted on a region of the oxide semiconductor layer corresponding to the pixel electrode, so as to form the pixel electrode, the active layer is formed in another region of the oxide semiconductor layer, and the data line is located on the active layer.

3. The manufacturing method of the array substrate claimed as claim 1, wherein a gate insulating thin film is formed on the pattern of the active layer, the pixel electrode and the data line;

through one patterning process, the at least two gate via-holes are formed in regions in the gate insulating thin film that correspond to outer surroundings of the active layer and do not overlap with areas where the pixel electrode and the data line are located, and the at least two gate via-holes are separated from the active layer, the pixel electrode and the data line by the gate insulating layer.

4. The manufacturing method of the array substrate claimed as claim 1, wherein a thickness of the gate insulating layer between the active layer and each of the at least two gate via-holes is in the range of 500 Å to 4000 Å.

5. The manufacturing method of the array substrate claimed as claim 1, wherein when the at least two gate electrodes are formed, at least one of them is formed with a gate extending section extending to a region that is over the active layer and not covered by the data line, and an area where the gate extending section is located does not overlap with an area where the data line is located.

6. The manufacturing method of the array substrate claimed as claim 1, wherein the at least two gate via-holes include a first via-hole and a second via-hole, one gate line and a first gate electrode and a second gate electrode that are connected to the gate line are formed for each pixel unit, the first gate electrode is situated in the first via-hole, and the second gate electrode is situated in the second via-hole.

7. The manufacturing method of the array substrate claimed as claim 1, wherein a first via-hole and a second via-hole are formed, and a first gate line and a second gate line as well as a first gate electrode and a second gate electrode are formed for the pixel electrode, the first gate electrode is connected to the first gate line and situated in the first via-hole, and the second gate electrode is connected to the second gate line and situated in the second via-hole.

8. The manufacturing method of the array substrate claimed as claim 3, wherein a thickness of the gate insulating thin film is in the range of 2000 Å to 6000 Å.

9. An array substrate, comprising: a base substrate, a pixel electrode, an active layer, a data line, a gate insulating layer and a gate metal layer,
wherein the pixel electrode and the active layer are located on the base substrate and connected to each other, the data line is located on the active layer, the gate insulating layer covers the base substrate, the pixel electrode, the active layer and the data line,
in regions in the gate insulating layer that correspond to outer surroundings of the active layer and do not overlap with areas where the pixel electrode and the data line are located, there are formed at least two gate via-holes, the at least two gate via-holes are separated from the active layer, the pixel electrode and the data line by the gate insulating layer; and
the gate metal layer includes at least one gate line and at least two gate electrodes that are connected to the at least one gate line, and provided in the at least two gate via-holes, respectively.

10. The array substrate claimed as claim 9, wherein a thickness of the gate insulating layer is in the range of 2000 Å to 6000 Å.

11. The array substrate claimed as claim 9, wherein a thickness of the gate insulating layer between the active layer and each of the at least two gate via-holes is in the range of 500 Å to 4000 Å.

12. The array substrate claimed as claim 9, wherein at least one of the at least two gate electrodes is formed with a gate extending section extending to a region that is over the active layer and not covered by the data line, and an area where the gate extending section is located does not overlap with an area where the data line is located.

13. The array substrate claimed as claim 9, comprising a first gate via-hole and a second gate via-hole,
wherein the gate metal layer includes one gate line and a first gate electrode and a second gate electrode that are connected to the gate line, the first gate electrode is situated in the first gate via-hole, and the second gate electrode is situated in the second gate via-hole.

14. The array substrate claimed as claim 9, wherein as for the pixel electrode, the gate metal layer includes a first gate line and a second gate line as well as a first gate electrode and a second gate electrode, the first gate electrode is connected to the first gate line and situated in a first gate via-hole, and the second gate electrode is connected to the second gate line and situated in a second gate via-hole.

15. The array substrate claimed as claim 9, comprising a thin film transistor, wherein an overlapping portion between the data line and the active layer is configured as a source electrode of the thin film transistor, and the active layer and the pixel electrode are connected together to be configured as a drain electrode of the thin film transistor.

16. A display device, comprising the array substrate claimed as claim 9.

17. A thin film transistor, comprising a source electrode, an active layer, a drain electrode, a gate insulating layer and at least two gate electrodes,
wherein the source electrode and the active layer at least partially overlap, the drain electrode and the active layer are located on a same layer and connected together, the gate insulating layer covers the source electrode, the active layer and the drain electrode, in regions in the gate insulating layer that correspond to outer surroundings of the active layer and do not overlap with areas where the drain electrode and the source electrode are located, there are formed at least two gate via-holes, and the at least two gate via-holes are separated from the active layer, the source electrode and the drain electrode by the gate insulating layer;
the at least two gate electrodes are connected to at least one gate line, and provided in the at least two gate via-holes, respectively.

18. The thin film transistor claimed as claim 17, wherein at least one of the at least two gate electrodes is formed with a gate extending section extending to a region that is over the active layer and not covered by the source electrode, and an area where the gate extending section is located does not overlap with an area where the source electrode is located.

19. The thin film transistor claimed as claim 17, comprising a first gate electrode and a second gate electrode as well as a first gate via-hole and a second gate via-hole,
wherein the first gate electrode and the second gate electrode are connected to one gate line, the first gate electrode is situated in the first gate via-hole, and the second gate electrode is situated in the second gate via-hole.

20. The thin film transistor claimed as claim 17, comprising a first gate line and a second gate line as well as a first gate electrode and a second gate electrode,
wherein the first gate electrode is connected to the first gate line and situated in a first gate via-hole, and the second gate electrode is connected to the second gate line and situated in a second gate via-hole.

* * * * *